(12) United States Patent
Tonegawa et al.

(10) Patent No.: US 11,733,319 B2
(45) Date of Patent: Aug. 22, 2023

(54) MAGNETIC SENSOR

(71) Applicant: SHOWA DENKO K.K., Tokyo (JP)

(72) Inventors: Sho Tonegawa, Ichihara (JP); Akira Sakawaki, Ichihara (JP); Rimpei Kindaichi, Ichihara (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 17/694,824

(22) Filed: Mar. 15, 2022

(65) Prior Publication Data
US 2022/0308124 A1   Sep. 29, 2022

(30) Foreign Application Priority Data

Mar. 26, 2021 (JP) .................. 2021-052624

(51) Int. Cl.
*G01R 33/05* (2006.01)
*G01R 33/00* (2006.01)
(52) U.S. Cl.
CPC ......... *G01R 33/0052* (2013.01); *G01R 33/05* (2013.01)
(58) Field of Classification Search
CPC ............. G01R 33/00; G01R 33/0035; G01R 33/0023; G01R 33/0017; G01R 31/3191; G01R 33/063; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 6,472,868 B1 | 10/2002 | Takayama et al. | |
| 2003/0006763 A1 | 1/2003 | Takayama et al. | |
| 2010/0156405 A1* | 6/2010 | Furukawa | B82Y 25/00 324/252 |
| 2015/0028863 A1* | 1/2015 | Zeyen | G01R 33/0011 29/602.1 |

FOREIGN PATENT DOCUMENTS

| | | | | |
|---|---|---|---|---|
| EP | 3640659 A1 * | 4/2020 | ......... G01R 33/0052 |
| JP | 2000-292506 A | 10/2000 | |

* cited by examiner

*Primary Examiner* — Jermele M Hollington
*Assistant Examiner* — Taqi R Nasir
(74) *Attorney, Agent, or Firm* — Sughrue Mion, PLLC

(57) ABSTRACT

Sensitivity of a magnetic sensor using the magnetic impedance effect is improved. A magnetic sensor includes: a non-magnetic substrate; a sensitive element provided on the substrate, including a soft magnetic material, having a longitudinal direction and a short direction, provided with uniaxial magnetic anisotropy in a direction intersecting the longitudinal direction, and sensing a magnetic field by a magnetic impedance effect; and a protrusion part including a soft magnetic material and protruding from an end portion in the longitudinal direction of the sensitive element.

14 Claims, 10 Drawing Sheets

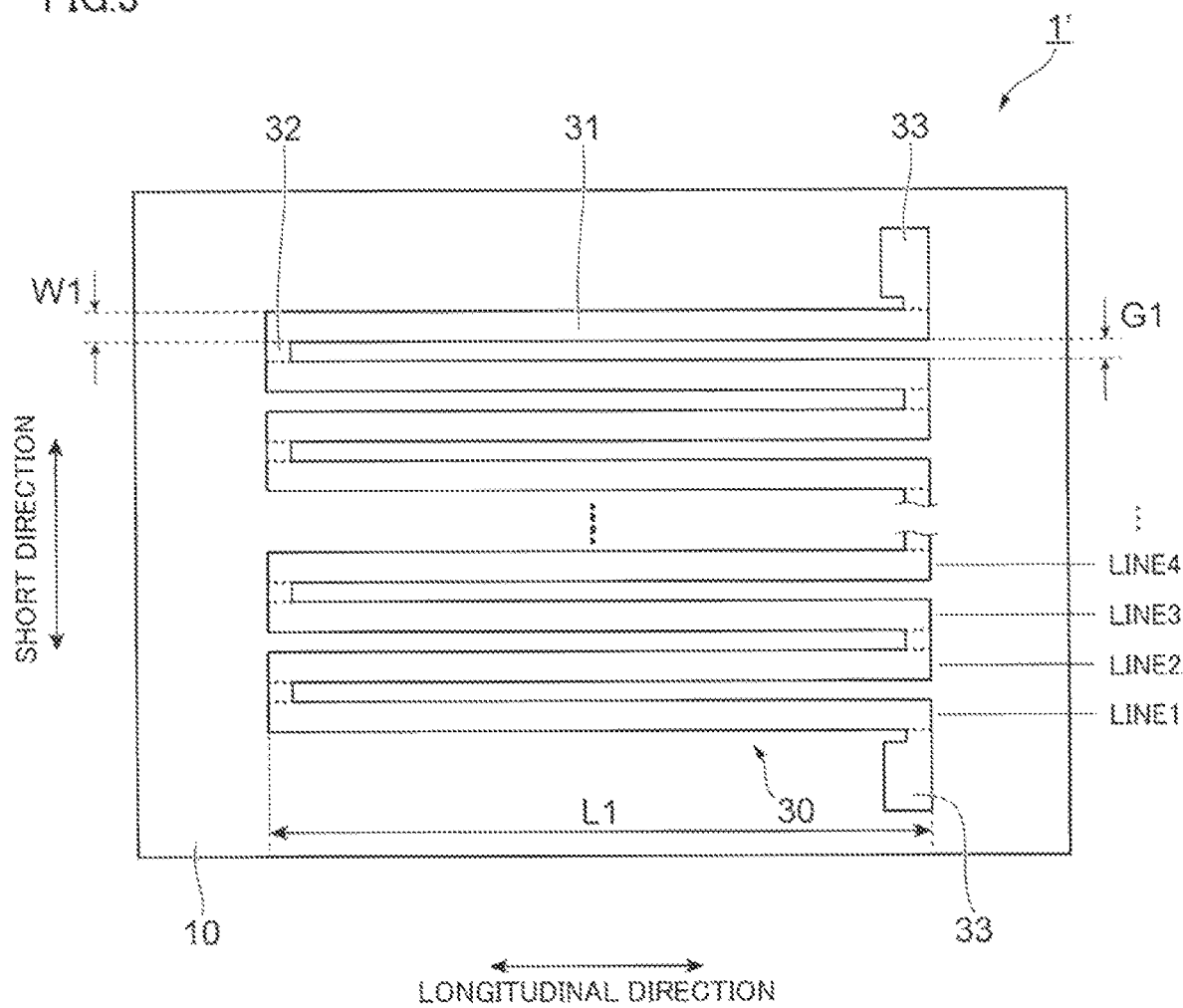

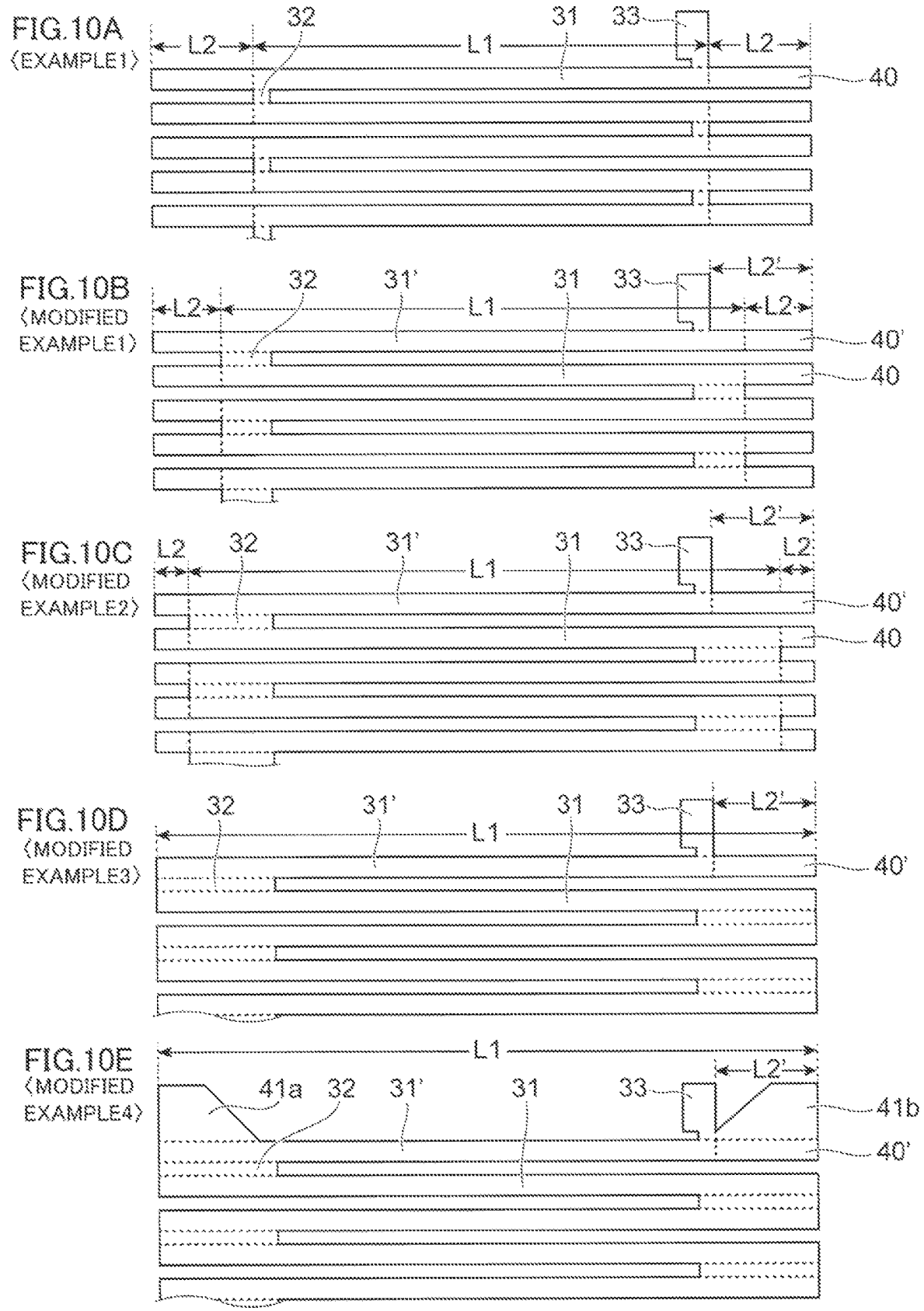

MAGNETIC SENSOR

CROSS REFERENCE TO RELATED APPLICATIONS

This application is based on and claims priority under 35 USC § 119 to Japanese Patent Application No. 2021-052624 filed Mar. 26, 2021, the disclosure is incorporated herein by reference in its entirety.

BACKGROUND

Technical Field

The present invention relates to a magnetic sensor.

Related Art

As a related art described in a gazette, there is a magnetic impedance element including a substrate made of a non-magnetic material, a thin-film magnetic core formed on the substrate, and first and second electrodes disposed on both ends of the thin-film magnetic core in a longitudinal direction, wherein at least two thin-film magnetic cores are disposed in parallel and electrically connected in series with each other (refer to Japanese Patent Application Laid-Open Publication No. 2000-292506).

By the way, the magnetic sensor provided with a sensitive element that senses the magnetic field uses the change in the impedance caused by the magnetic fields (internal magnetic fields) applied to the sensitive element. Consequently, to improve sensitivity of the magnetic sensor, it is required to increase the internal magnetic fields when constant external magnetic fields are applied.

An object of the present invention is to improve sensitivity of a magnetic sensor using the magnetic impedance effect.

SUMMARY

A magnetic sensor to which the present invention is applied includes: a non-magnetic substrate; a sensitive element provided on the substrate, including a soft magnetic material, having a longitudinal direction and a short direction, provided with uniaxial magnetic anisotropy in a direction intersecting the longitudinal direction, and sensing a magnetic field by a magnetic impedance effect; and a protrusion part including a soft magnetic material and protruding from an end portion in the longitudinal direction of the sensitive element.

Moreover, the protrusion part may protrude in the longitudinal direction.

Further, the sensitive element may include a wide shape at the end portion in the longitudinal direction, the wide shape having a width in the short direction that is wider than a width in the short direction at a center portion in the longitudinal direction.

Still further, the sensitive element may have a taper shape that is narrowed from the wide shape toward the center portion.

Moreover, the protrusion part may have a width equal to a maximum width in the short direction of the sensitive element.

From another standpoint, a magnetic sensor to which the present invention is applied includes: a non-magnetic substrate; plural sensitive elements arranged in a short direction with gaps, each of the sensitive elements being provided on the substrate, including a soft magnetic material, having a longitudinal direction and the short direction, being provided with uniaxial magnetic anisotropy in a direction intersecting the longitudinal direction, and sensing a magnetic field by a magnetic impedance effect; a connection part connecting end portions in the longitudinal direction of the sensitive elements that are adjacent in the short direction; and a protrusion part included in at least one of the sensitive elements, the protrusion part including a soft magnetic material and protruding from an end portion in the longitudinal direction of the sensitive element.

Moreover, in such a magnetic sensor, the connection part may include plural connection parts, and the plural sensitive elements may be windingly connected in series by the plural connection parts.

According to the present invention, it is possible to improve sensitivity of a magnetic sensor using the magnetic impedance effect.

BRIEF DESCRIPTION OF THE DRAWINGS

Exemplary embodiments of the present invention will be described in detail based on the following figures, wherein:

FIG. 3 shows a planar shape of a conventional magnetic sensor without including protrusion parts;

FIGS. 10A to 10E illustrate Example 1 and Modified examples 1 to 4 of the magnetic sensor.

DETAILED DESCRIPTION

Hereinafter, exemplary embodiments according to the present invention will be described with reference to attached drawings.

First Exemplary Embodiment (Configuration of Magnetic Sensor 1 to which the First Exemplary Embodiment is Applied)

Figure 1A:
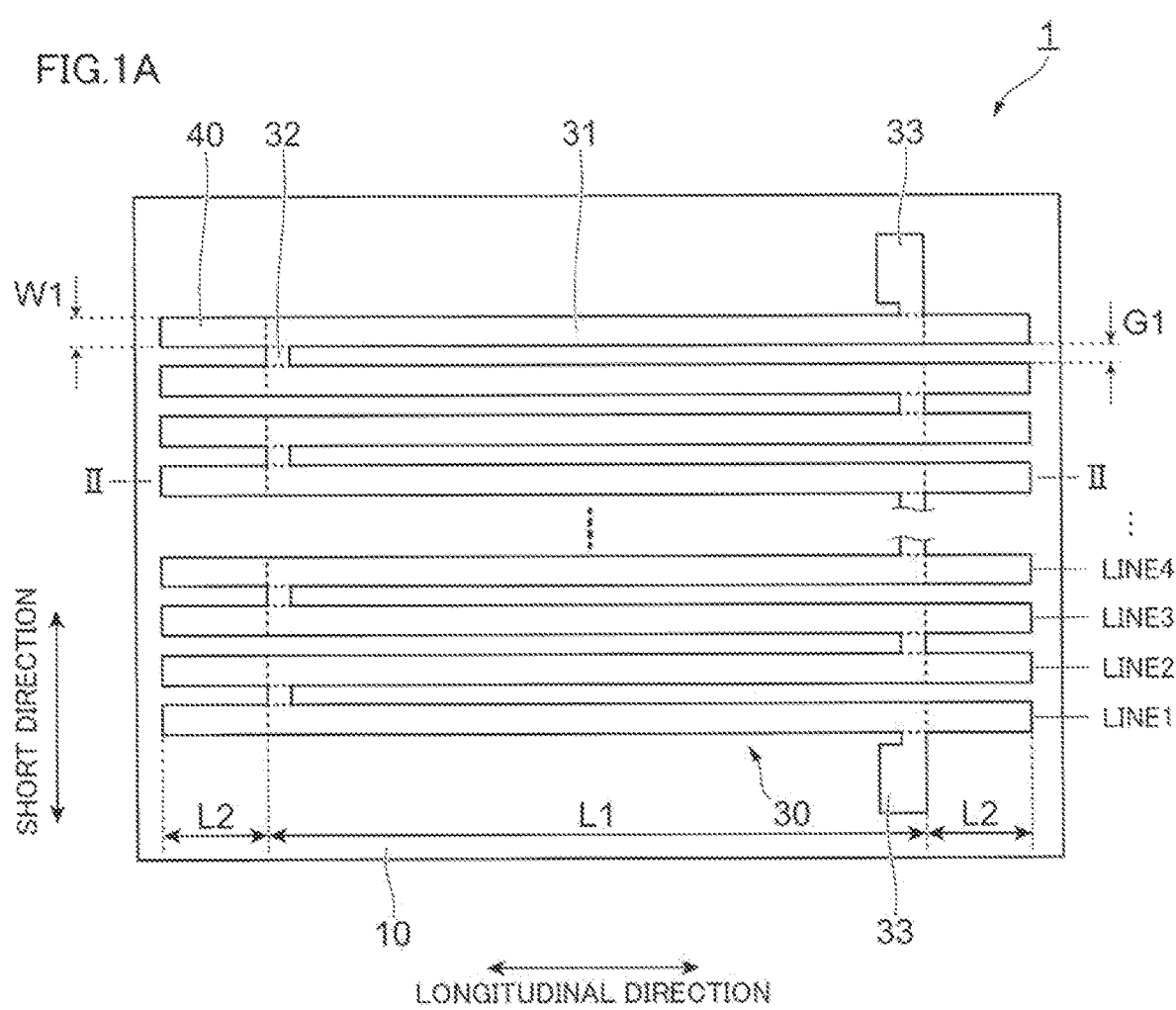
FIGS. 1A and 1B show diagrams illustrating a specific example of a magnetic sensor to which the first exemplary embodiment is applied.
Figure 1B:
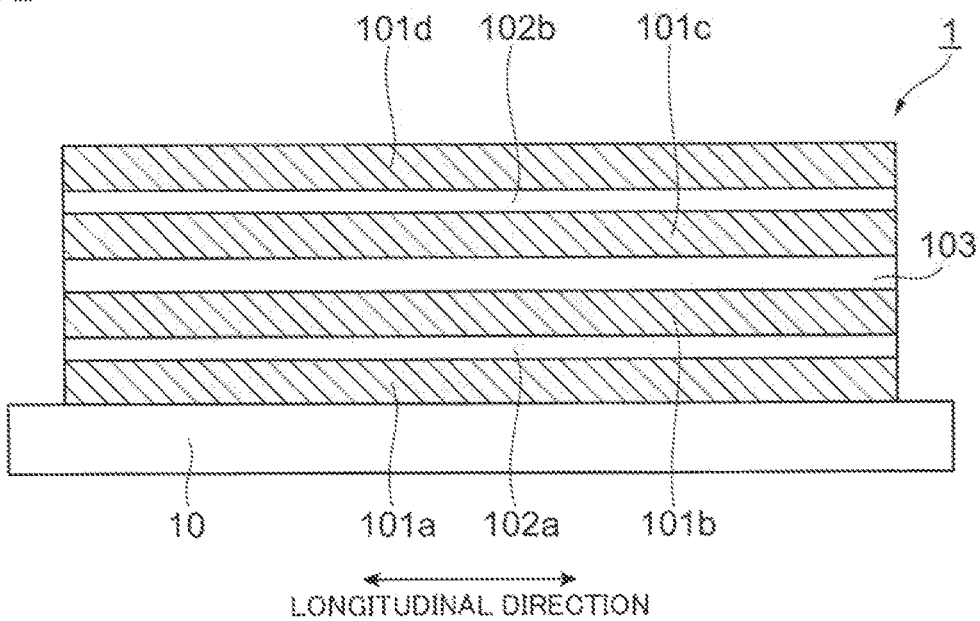

FIGS. 1A and 1B show diagrams illustrating a specific example of a magnetic sensor 1 to which the first exemplary embodiment is applied.

FIG. 1A is a plan view of the magnetic sensor 1, and FIG. 1B is a cross-sectional view along the II-II line in FIG. 1A.

As shown in FIG. 1A, the magnetic sensor 1, to which the first exemplary embodiment is applied, includes: a non-magnetic substrate 10; a sensitive part 30 provided on the substrate 10 and including a soft magnetic material layer that senses the magnetic field; and protrusion parts 40 including the soft magnetic material layer.

Description will be given of a planar structure of the magnetic sensor 1 by FIG. 1A. The magnetic sensor 1 has a quadrangular planar shape as a specific example. The planar shape of the magnetic sensor 1 is several millimeters square. For example, the length in the longitudinal direction is 4 mm to 6 mm, and the length in the short direction is 3 mm to 5 mm. Note that the size of the planar shape of the magnetic sensor 1 may be other values.

First, the sensitive part 30 formed in the magnetic sensor 1 will be described. The sensitive part 30 includes: plural rectangular-shaped sensitive elements 31 each having a longitudinal direction and a short direction in a planar shape thereof; connection parts 32 windingly performing serial connection of the adjacent sensitive elements 31; and terminal parts 33 to which electric wires for supplying the electrical current are connected. Note that the longitudinal direction corresponds to the left and right direction, and the short direction corresponds to the vertical direction in FIG. 1A. In addition, in the magnetic sensor 1, sensitive element 31 is a magneto-impedance effect element that senses the magnetic field or the change in the magnetic field. In other words, the magnetic field or change in the magnetic field is measured based on the change in the impedance of the sensitive part 30 in which the sensitive elements 31 are connected in series. Hereinafter, the impedance of the sensitive part 30 is sometimes referred to as the impedance of the magnetic sensor 1.

Here, as shown in FIG. 1A, plural sensitive elements 31 in the magnetic sensor 1 are configured to have a rectangular shape with a width W1 in the short direction and a length L1 in the longitudinal direction. The plural sensitive elements 31 are arranged in the short direction with gaps G1. Note that the first, the second, the third, . . . , of the plural sensitive elements 31 arranged in the short direction as described above counted from the bottom of the page are sometimes referred to as the line 1, the line 2, the line 3, . . . , respectively.

By the way, FIG. 1A shows the plural sensitive elements 31, but the number of sensitive elements 31 may be one. It may also be more than eight as shown in the figure.

The connection part 32 is provided at the end portion of the sensitive element 31 and windingly performs serial connection of adjacent sensitive elements 31 at the end portions thereof in the longitudinal direction. For example, Example 1 of the magnetic sensor shown in Table 1 to be described later includes 24 sensitive elements 31, and therefore, 23 connection parts 32.

Note that, in another exemplary embodiment, if the number of sensitive elements 31 is assumed to be one, the connection part 32 is not included in some cases.

The terminal parts 33 are provided to the two respective end portions of the sensitive elements 31, the end portions not being connected to the connection parts 32. The terminal part 33 functions as a pad part that connects electric wires for supplying the electrical current. The terminal part 33 may have a size capable of connecting the electric wires. Note that, in FIG. 1A, the two terminal parts 33 are provided on the right side of the page, but the terminal parts 33 may be provided on the left side, or may be provided to be divided on the left and right.

Further, the magnetic sensor 1 includes protrusion parts 40 at both end portions in the longitudinal direction of the sensitive element 31. For more details, the protrusion parts 40 protruding toward the longitudinal direction sides from both end portions in the longitudinal direction of the sensitive element 31 are provided. In other words, the protrusion part 40 protrudes in the longitudinal direction of the sensitive element 31. The protrusion part 40 is provided to have a rectangular shape with the width W1 in the short direction, which is equal to the width of the sensitive element 31, and the length L2 in the longitudinal direction.

The protrusion part 40 on the side where the magnetic force lines are inputted from the outside induces the magnetic force lines from the outside to the sensitive element 31. In addition, the protrusion part 40 on the side where the magnetic force lines are outputted from the sensitive element 31 induces the magnetic force lines passed through the sensitive element 31 to pass through the protrusion part 40. In other words, the protrusion part 40 functions as a yoke that induces the magnetic force lines. Therefore, the protrusion part 40 includes the soft magnetic material (the soft magnetic material layer 101 to be described later) through which the magnetic force lines are likely to pass through.

Here, the protrusion part 40 protrudes in the longitudinal direction of the sensitive element 31. The protrusion part 40 may be made to protrude in a direction different from (intersecting) the longitudinal direction, but protrusion part 40 protruded in the longitudinal direction easily induces the magnetic force lines as described later. Then, in the case where the magnetic sensor 1 includes the plural sensitive elements 31, the protrusion parts 40 protrude from the sensitive part 30 in a comb-teeth shape.

Next, with reference to FIG. 1B, the cross-sectional structure of the magnetic sensor 1 will be described in detail. The magnetic sensor 1 includes, as a specific example, four soft magnetic material layers 101a, 101b, 101c, and 101d from the substrate 10 side. Then, between the soft magnetic material layer 101a and the soft magnetic material layer 101b, a magnetic domain suppression layer 102a that suppresses occurrence of a closure magnetic domain in the soft magnetic material layer 101a and the soft magnetic material layer 101b is provided. The sensitive part 30 further includes, between the soft magnetic material layer 101c and the soft magnetic material layer 101d, a magnetic domain suppression layer 102b that suppresses occurrence of a closure magnetic domain in the soft magnetic material layer 101c and the soft magnetic material layer 101d. Also, the sensitive part 30 includes, between the soft magnetic material layer 101b and the soft magnetic material layer 101c, a conductor layer 103 that reduces resistance (here, refer to the electrical resistance) of the sensitive part 30. In the case where the soft magnetic material layers 101a, 101b, 101c, and 101d are not distinguished, the layers are referred to as the soft magnetic material layers 101. In the case where the magnetic domain suppression layers 102a and 102b are not distinguished, the layers are referred to as the magnetic domain suppression layers 102.

The substrate 10 is composed of a non-magnetic material; for example, an oxide substrate, such as glass or sapphire, a semiconductor substrate, such as silicon, or a metal substrate, such as aluminum, stainless steel, or a nickel-phosphorus-plated metal, can be provided. Hereinafter, description will be given on the assumption that the substrate 10 is made of glass.

The soft magnetic material layer 101 is configured with a soft magnetic material of an amorphous alloy showing the magnetic impedance effect. As the soft magnetic material constituting the soft magnetic material layer 101, an amorphous alloy, which is an alloy containing Co as a main component doped with a high melting point metal, such as Nb, Ta or W, may be used. Specific examples of such an alloy containing Co as a main component include CoNbZr, CoFeTa, CoWZr, and CoFeCrMnSiB. The thickness of the soft magnetic material layer 101 is, for example, 100 nm to 1 μm.

Here, the soft magnetic material has a small, so-called coercive force, the soft magnetic material being easily magnetized by an external magnetic field, but, upon removal of the external magnetic field, quickly returning to a state with no magnetization or a little magnetization.

In addition, in this specification, amorphous alloys and amorphous metals refer to those having structures that do not have a regular arrangement of atoms such as crystals, which are formed by the sputtering method, etc.

The magnetic domain suppression layer 102 suppresses occurrence of the closure magnetic domain in the upper and lower soft magnetic material layers 101 that sandwich the magnetic domain suppression layer 102.

In general, in the soft magnetic material layer 101, plural magnetic domains with different directions of magnetization are likely to be formed. In this case, a closure magnetic domain showing annular-shaped magnetization direction is formed. As the external magnetic field is increased, the magnetic domain walls are displaced; thereby the area of the magnetic domain with the magnetization direction that is the same as the direction of the external magnetic field is increased, whereas the area of the magnetic domain with the magnetization direction that is opposite to the direction of the external magnetic field is decreased. Then, as the external magnetic field is further increased, in the magnetic domain where the magnetization direction is different from the direction of the external magnetic field, magnetization rotation is generated so that the magnetization direction is the same as the direction of the external magnetic field. Finally, the magnetic domain wall that existed between the adjacent magnetic domains disappears and the adjacent magnetic domains become a magnetic domain (a single magnetic domain). In other words, when the closure magnetic domain is formed, as the external magnetic field changes, the Barkhausen effect, in which the magnetic domain walls constituting the closure magnetic domain are displaced in a stepwise and discontinuous manner, is generated. The discontinuous displacement of the magnetic domain walls result in noise in the magnetic sensor 1, which causes a risk of reduction in S/N in the output obtained from the magnetic sensor 1. The magnetic domain suppression layer 102 suppresses formation of plural magnetic domains with small areas in the soft magnetic material layers 101 provided on upper and lower sides of the magnetic domain suppression layer 102. This suppresses the formation of the closure magnetic domain and suppresses the noise generated by discontinuous displacement of the magnetic domain walls. Note that, in the case where the magnetic domain suppression layer 102 is provided, it is better to have less magnetic domains to be formed, that is, the effect of increasing the size of the magnetic domains can be obtained, as compared to the case where the magnetic domain suppression layer 102 is not provided.

Specific examples of materials of such a magnetic domain suppression layer 102 include non-magnetic materials, such as Ru and $SiO_2$, and non-magnetic amorphous metals, such as CrTi, AlTi, CrB, CrTa, and CoW. The thickness of such a magnetic domain suppression layer 102 is, for example, 10 nm to 100 nm.

The conductor layer 103 reduces the resistance of the sensitive part 30. For more details, the conductor layer 103 has conductivity higher than that of the soft magnetic material layer 101, and reduces the resistance of the sensitive part 30, as compared to the case where the conductor layer 103 is not included. The magnetic sensor 1 measures the magnetic field or change in the magnetic field as the change in the impedance (hereinafter, referred to as the impedance Z) (the change in the impedance is referred to as ΔZ) when the alternating current is passed between the two terminal parts 33. On this occasion, as the frequency of the alternating current is higher, the rate of change in the impedance Z with respect to the change in the external magnetic field ΔZ/ΔH (hereinafter, referred to as the impedance change rate ΔZ/ΔH) (the change in the external magnetic field is referred to as ΔH) is increased. However, if the frequency of the alternating current is increased without including the conductor layer 103, the impedance change rate ΔZ/ΔH is reduced by the floating capacitance in the state of the magnetic sensor 1. Assuming that the resistance of the sensitive part 30 is R, the floating capacitance is C, and the magnetic sensor 1 is the parallel circuit of the resistance R and the floating capacitance C, the relaxation frequency $f_0$ of the magnetic sensor 1 can be represented by Expression (1).

[Math. 1]

$$f_0 = \frac{1}{2\pi RC} \quad (1)$$

As can be seen from Expression (1), when the floating capacitance C is large, the relaxation frequency $f_0$ is small; when the frequency of the alternating current is higher than the relaxation frequency $f_0$, the impedance change rate ΔZ/ΔH is reduced conversely. Therefore, the conductor layer 103 is provided for reducing the resistance R of the sensitive part 30, to thereby increase the relaxation frequency $f_0$.

As such a conductor layer 103, it is preferable to use metal or an alloy having high conductivity, and is more preferable to use metal or an alloy that is highly conductive and non-magnetic. Specific examples of materials of such a conductor layer 103 include metal, such as Al, Cu, Ag, and Au. The thickness of the conductor layer 103 is, for example, 10 nm to 1 μm. It is sufficient that the conductor layer 103 can reduce the resistance of the sensitive part 30, as compared to the case where the conductor layer 103 is not included.

Note that the upper and lower soft magnetic material layers 101 sandwiching the magnetic domain suppression layer 102 and the upper and lower soft magnetic material layers 101 sandwiching the conductor layer 103 are antiferromagnetically coupled (AFC) with each other. Due to the upper and lower soft magnetic material layers 101 that are antiferromagnetically coupled, occurrence of demagnetizing fields is suppressed and the sensitivity of the magnetic sensor 1 is improved.

(Manufacturing of Magnetic Sensor)

The magnetic sensor 1, to which the exemplary embodiment of the present invention is applied, is manufactured as follows.

First, on the substrate 10, a photoresist pattern to cover portions of the surface of the substrate 10 excluding the planar shape of the sensitive part 30 and the protrusion parts 40 is formed by using the photolithography technique that is publicly known. Subsequently, on the substrate 10, the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d are deposited in this order by, for example, the sputtering method. Then, the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d deposited on the photoresist are removed with the photoresist. Consequently, on the substrate 10, a laminated body configured with the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d processed into the planar shape of the sensitive part 30 and the protrusion parts 40 is left. In this manner, the lamination structure shown in FIG. 1B is formed.

The soft magnetic material layer 101 is provided with uniaxial magnetic anisotropy in a direction intersecting the longitudinal direction, for example, the short direction. Note that the direction intersecting the longitudinal direction may have an angle exceeding 45° and not more than 90° with respect to the longitudinal direction. The uniaxial magnetic anisotropy can be imparted by performing, for example, the heat treatment at 400° C. in a rotating magnetic field of 3 kG (0.3T) (heat treatment in the rotating magnetic field) and the heat treatment at 400° C. in a static magnetic field of 3 kG (0.3T) (heat treatment in the static magnetic field) subsequent thereto on the sensitive element 31 formed on the substrate 10. Impartation of the uniaxial magnetic anisotropy may be performed in depositing the soft magnetic material layer 101 constituting the sensitive element 31 by use of a magnetron sputtering method, instead of being performed in the heat treatment in the rotating magnetic field and heat treatment in the static magnetic field. In other words, by the magnetic field formed by the magnets used in the magnetron sputtering method, the soft magnetic material layer 101 is deposited, and at the same time, the uniaxial magnetic anisotropy is imparted to the soft magnetic material layer 101.

In the manufacturing method described above, the connection parts 32, the terminal parts 33, and the protrusion parts 40 are simultaneously formed integrally with the sensitive elements 31.

The connection parts 32 and the terminal parts 33 may be formed with a metal having conductivity, such as Al, Cu, Ag, or Au. In addition, the metal having conductivity, such as Al, Cu, Ag, or Au, may be laminated on the connection parts 32 and the terminal parts 33 simultaneously formed integrally with the sensitive elements 31.

Further, the protrusion part 40 may be configured with a soft magnetic material of a kind different from that of the sensitive element 31.

(Relation Between Magnetic Field and Impedance)

Figure 2:
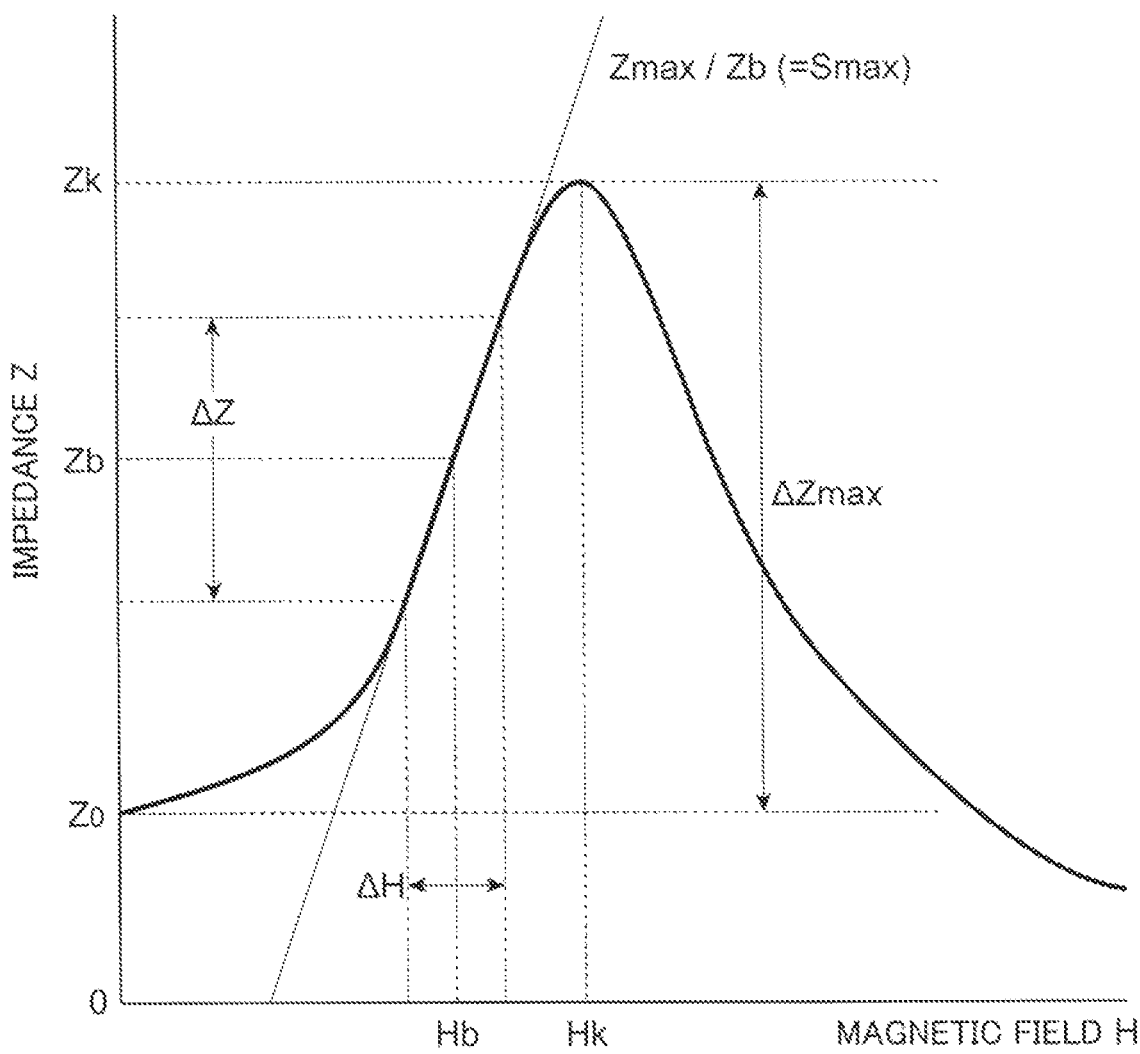
FIG. 2 illustrates a relation between a magnetic field H applied in the longitudinal direction of a sensitive element and an impedance Z of the sensitive element.

Here, by use of FIG. 2, description will be given of a relation between the magnetic field applied in the longitudinal direction of the sensitive element 31 of the magnetic sensor and the impedance of the sensitive part 30. In FIG. 2, the horizontal axis indicates the magnetic field H, and the vertical axis indicates the impedance Z.

As shown in FIG. 2, the impedance Z of the sensitive part 30 takes the value Z0 when the magnetic field H applied in the longitudinal direction of the sensitive element 31 is 0. Then, the impedance Z increases as the magnetic field H increases, and takes the maximum value Zk when the magnetic field H becomes the anisotropic magnetic field Hk. Then, when the magnetic field H becomes larger than the anisotropic magnetic field Hk, the impedance Z is reduced conversely. The amount of change from the impedance Z0 to the maximum value Zk of the impedance Z, Zk−Z0, is referred to as the impedance change amount ΔZmax.

Within a range in which the magnetic field H is smaller than the anisotropic magnetic field Hk, by use of a portion where the amount of change ΔZ in the impedance Z with respect to the amount of change ΔH in the magnetic field H is steep, namely, a portion where the impedance change rate ΔZ/ΔH is large, it is possible to extract extremely weak change in the magnetic field H as the amount of change ΔZ in the impedance Z. In FIG. 2, the center of the magnetic field H where the impedance change rate ΔZ/ΔH is large is shown as the magnetic field Hb. In other words, it is possible to measure the amount of change ΔH in the magnetic field H in the vicinity to the magnetic field Hb (the range indicated by the ΔH arrow in FIG. 2) with high accuracy.

Here, the portion where the impedance change rate ΔZ/ΔH is the largest, that is, the amount of change in the impedance Zmax per unit magnetic field in the magnetic field Hb divided by the impedance Zb in the magnetic field Hb (Zmax/Zb) is the sensitivity. As the sensitivity Zmax/Zb is higher, the magnetic impedance effect becomes larger and the magnetic field or change in the magnetic field can be easily measured. To put it another way, the sensitivity Zmax/Zb becomes higher as the change in the impedance Z with respect to the magnetic field H is steeper. The smaller the anisotropic magnetic field Hk, the better. In addition, the larger the amount of change in the impedance ΔZmax, the better.

In other words, in the magnetic sensor, it is preferable that the sensitivity Zmax/Zb is high, and for this, it is preferable that the anisotropic magnetic field Hk is small. In addition, it is preferable that the amount of change in the impedance ΔZmax is large.

Note that, in the following description, the sensitivity Zmax/Zb is referred to as sensitivity Smax. Moreover, the magnetic field Hb is referred to as a bias magnetic field Hb in some cases.

(Action of Magnetic Sensor 1)

Subsequently, the action of the magnetic sensor 1, to which the first exemplary embodiment is applied, will be described, while being compared to a conventional magnetic sensor 1' that does not include the protrusion parts 40 (hereinafter, referred to as a conventional magnetic sensor 1').

FIG. 3 shows a planar shape of the conventional magnetic sensor 1' without including the protrusion parts 40.

The conventional magnetic sensor 1' has the same configuration as the magnetic sensor 1 shown in FIG. 1A, except that the protrusion parts 40 are not included. For more details, the conventional magnetic sensor 1' is configured with the sensitive part 30 including the plural sensitive elements 31, the connection parts 32, and the terminal parts 33, and the non-magnetic substrate 10.

Figure 4A:
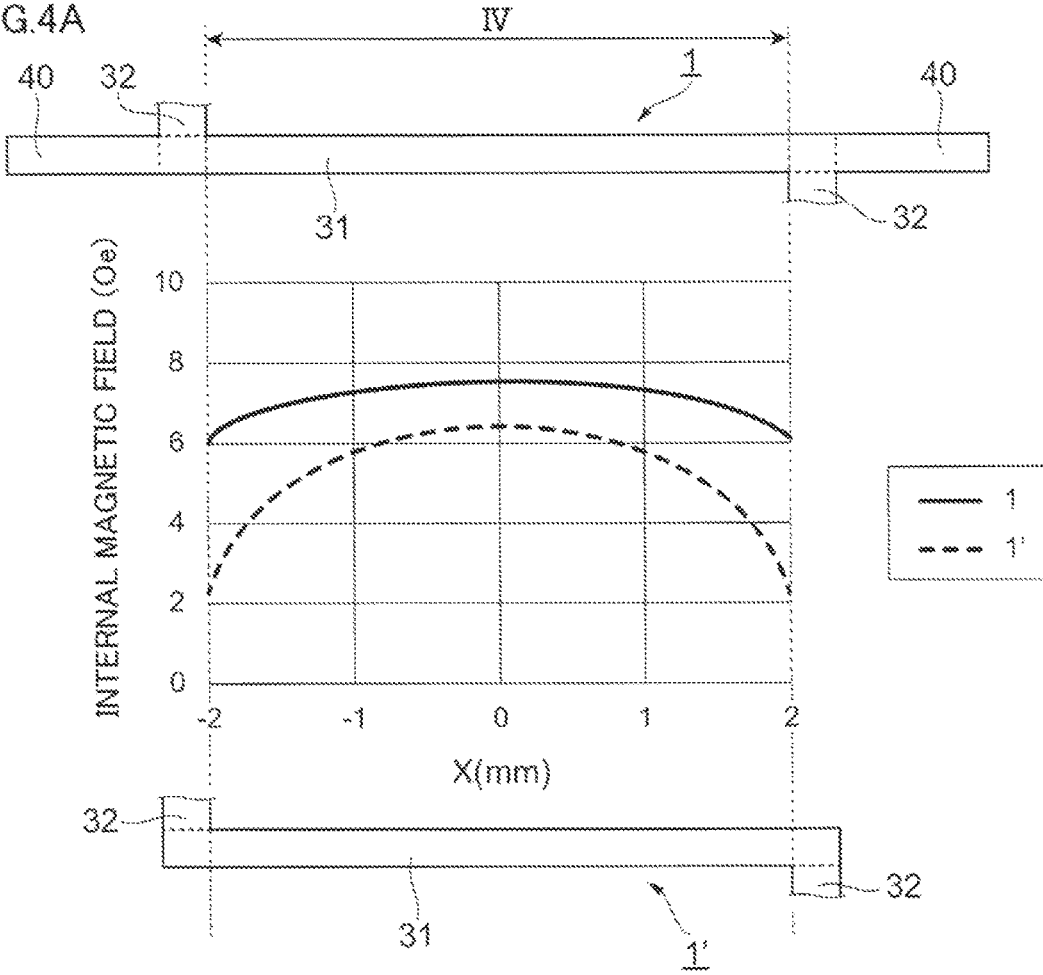
FIGS. 4A and 4B show simulation results of the magnitude of the internal magnetic field in the sensitive part when the external magnetic field of a predetermined magnitude is applied to the magnetic sensor.
Figure 4B:
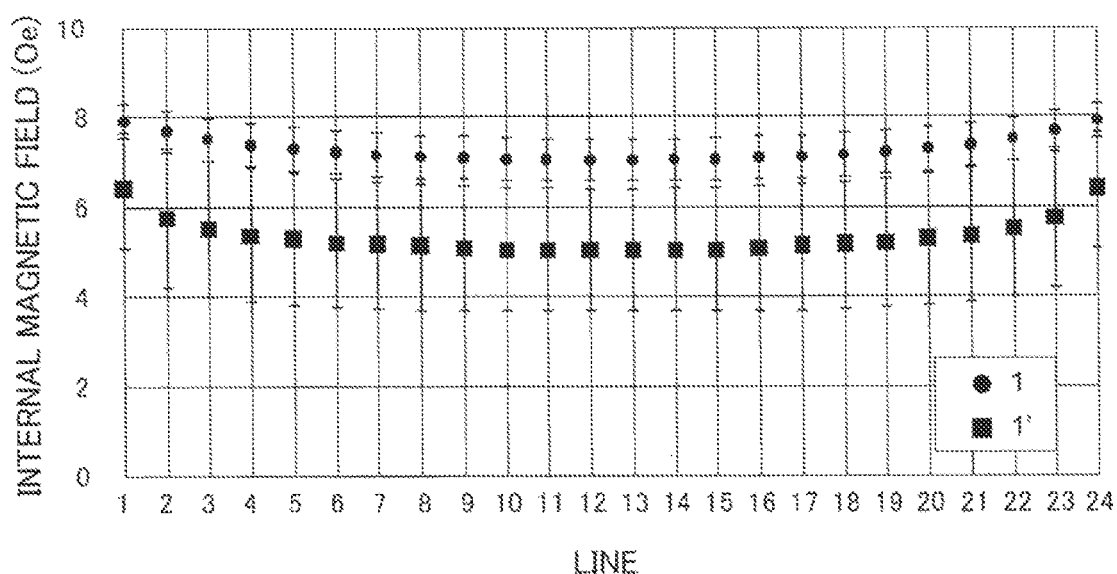

FIGS. 4A and 4B show simulation results of the magnitude of the internal magnetic field in the sensitive part 30 when the external magnetic field of a predetermined magnitude is applied to the magnetic sensors 1 and 1'. FIG. 4A shows the magnitude of the internal magnetic field in the sensitive part 30 as the distribution along the longitudinal direction, and FIG. 4B shows the internal magnetic field in each line of the magnetic sensors 1 and 1'. Note that FIG. 4A shows the shape of the sensitive element 31, the connection parts 32, and the protrusion parts 40 of the magnetic sensors 1 and 1', as well as the magnitude of the magnetic field applied to the sensitive part 30.

Note that, in this simulation, the external magnetic field applied to the magnetic sensors 1 and 1' is assumed to be 10 Oe. It is also assumed that the number of sensitive elements 31 in the magnetic sensors 1 and 1' is 24 (the line 1 to the line 24), the width W1 and the length L1 of the sensitive element 31 are 0.1 mm and 4.2 mm, respectively, the gap G1 between the adjacent sensitive elements 31 is 0.05 mm, and further, the length L2 of the protrusion part 40 of the magnetic sensor 1 is 1.0 mm.

FIG. 4A shows the magnitude of the internal magnetic field in the sensitive part 30 of the magnetic sensors 1 and 1' as the distribution along the longitudinal direction. The horizontal axis indicates a position X (mm) in the longitudinal direction of the sensitive part 30, and the vertical axis indicates the magnitude of the internal magnetic field at the position X (Oe). Note that the results are shown, not for the entirety of the longitudinal direction of the sensitive part 30, but for the region IV indicated by the broken line only.

As shown in FIG. 4A, in the magnetic sensor 1, the magnitude of the internal magnetic field in the sensitive part 30 is increased as compared to the conventional magnetic sensor 1'. The sharp drop in the magnetic field at the end portions in the longitudinal direction observed in the conventional magnetic sensor 1' is suppressed in the magnetic sensor 1. This makes the internal magnetic field uniform over the longitudinal direction.

Next, FIG. 4B shows the magnitude of the internal magnetic field in each of the lines 1 to 24 of the sensitive elements 31 included in the magnetic sensors 1 and 1'. The horizontal axis indicates the number N of the corresponding line, and the vertical axis indicates the average value (Oe) of the magnitude of the internal magnetic field in the line N. Note that the error bar shows the distribution of the magnitude of the internal magnetic field in the line N.

As shown in FIG. 4B, in the magnetic sensor 1, the magnitude of the internal magnetic field is increased in all lines (the lines 1 to 24) of the sensitive elements 31, as compared to the conventional magnetic sensor 1'. In addition, the distribution of the magnitude of the internal magnetic field (the error bars) is smaller in all lines. In other words, in the magnetic sensor 1, the internal magnetic field in all lines is more uniform over the longitudinal direction as compared to the conventional magnetic sensor 1'.

As a result, in the magnetic sensor 1, as shown in FIGS. 4A and 4B, the magnetic field is concentrated on the sensitive element 31 and the magnetic flux density is increased. In addition, reduction in the magnetic flux density at the end portions of the sensitive element 31 is suppressed. Then, as compared to the conventional magnetic sensor 1', the magnitude of the magnetic field related to the sensitive element 31 becomes uniform over the longitudinal direction, and the magnetic field related to the sensitive element 31 is increased.

Figure 5A:
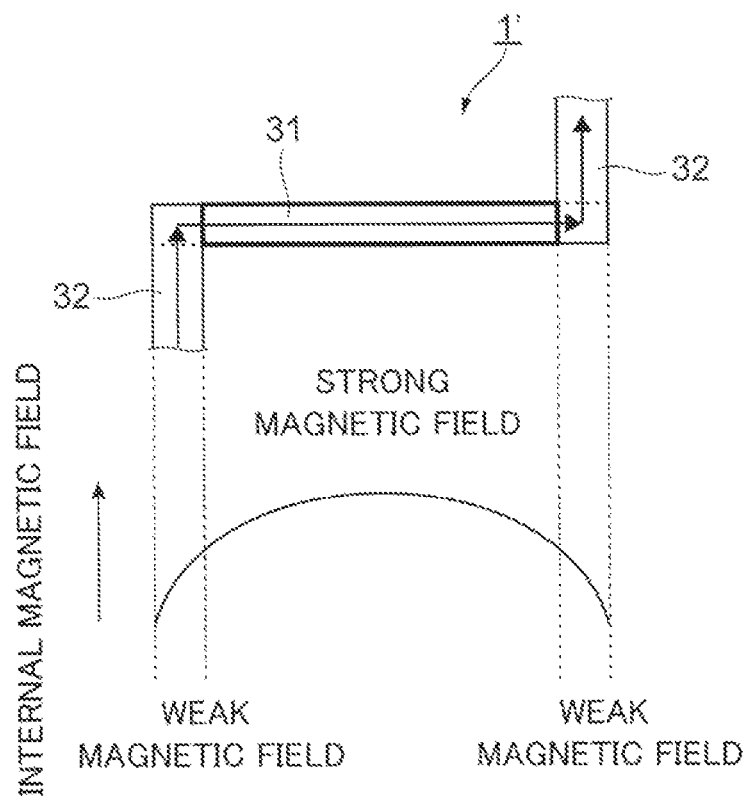
FIGS. 5A and 5B illustrate effects of the protrusion part.
Figure 5B:
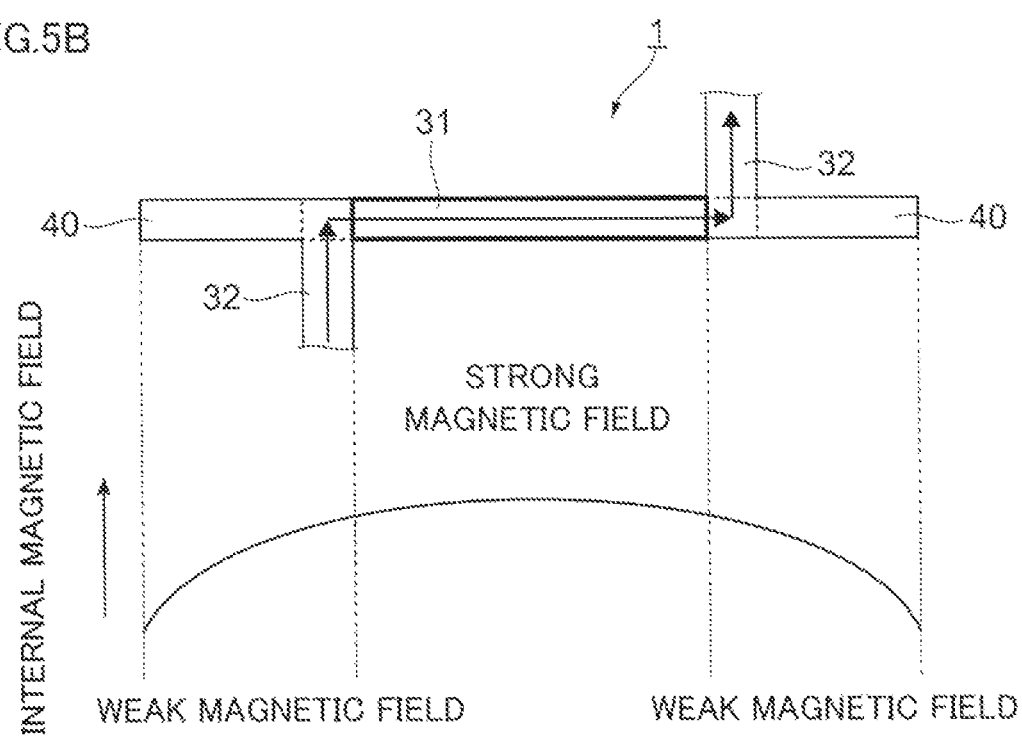

Here, the effects of the protrusion part 40 will be described. FIGS. 5A and 5B show the magnitude of the internal magnetic field, when the external magnetic field is applied, over all region in the longitudinal direction of the magnetic sensor. FIG. 5A corresponds to the conventional magnetic sensor 1' without the protrusion parts, and FIG. 5B corresponds to the magnetic sensor 1 with the protrusion parts. Note that the arrows in FIGS. 5A and 5B indicate the current applied when the magnetic sensor is operated.

In the conventional magnetic sensor 1' shown in FIG. 5A, the internal magnetic field is stronger at the center portion of the sensitive element 31, but the internal magnetic field is sharply reduced at both ends in the longitudinal direction. In addition, as shown in FIG. 5A, when the current is applied to the conventional magnetic sensor 1', the current flows through both ends thereof where the internal magnetic field is weak. As a result, in the magnetic sensor 1', there is a possibility that the change in the impedance to be generated is small and the sensitivity is degraded.

On the other hand, in the magnetic sensor 1 shown in FIG. 5B, the protrusion parts 40 are provided, and thereby the magnetic force lines from a wide range in the outside are induced to the sensitive element 31. In addition, the magnetic force lines passed through the sensitive element 31 are induced to directly pass through the protrusion parts 40. Consequently, sharp reduction of the internal magnetic field at both ends in the longitudinal direction of the sensitive element 31 is suppressed. In other words, the regions of weak internal magnetic field are pushed (or moved) from both ends of the sensitive element 31 toward the ends of the protrusion parts 40. Then, in this magnetic sensor 1, the internal magnetic field in the portion where the current flows is strong and uniform in the longitudinal direction. As a result, in the magnetic sensor 1, the change in the impedance to be generated is increased and the sensitivity is improved, as compared to the magnetic sensor 1'.

Table 1 shows values of the average magnetic field, the anisotropic magnetic field Hk, the amount of change in the impedance ΔZmax, and the sensitivity Smax for the magnetic sensor 1 to which the exemplary embodiment of the present invention is applied and the conventional magnetic sensor 1'.

The shape in Table 1 indicates which configuration of the magnetic sensors 1 or 1', as described in FIGS. 1A, 1B and 3, each of the examples and comparative examples corresponds to. The shape 1 corresponds to the magnetic sensor 1 shown in FIG. 1A, to which the first exemplary embodiment is applied, and the shape 1' corresponds to the conventional magnetic sensor 1' shown in FIG. 3.

Examples 1 to 3 and Comparative examples 1 and 2 described in Table 1 are magnetic sensors including: the substrate 10 configured with a glass substrate; the soft magnetic material layers 101a to 101d each configured with a $Co_{80}Nb_{17}Zr_3$ layer with a thickness of 500 nm; the magnetic domain suppression layers 102a and 102b each configured with a CrTi layer with a thickness of 25 nm; and the conductor layer 103 configured with an Ag layer with a thickness of 400 nm.

The average magnetic fields in Table 1 were obtained by the computer simulation results described above. More specifically, the average magnetic field is, when an external magnetic field of 10 Oe is applied to the magnetic sensor, the average value in the length direction of the internal magnetic field in each sensitive element 31 averaged out by all sensitive elements 31 (all lines) included in the magnetic sensor.

The values of the anisotropic magnetic field Hk, the amount of change in the impedance ΔZmax and the sensitivity Smax in Table 1 were obtained by measurement by passing the high-frequency current of 100 MHz between the two terminal parts 33 in each magnetic sensor.

TABLE 1

|  | Shape | The number of sensitive elements | W1 (mm) | G1 (mm) | L1 (mm) | L2 (mm) | Average magnetic field (Oe) | Hk (Oe) | ΔZmax (Ω) | Smax (1/Oe) |
| --- | --- | --- | --- | --- | --- | --- | --- | --- | --- | --- |
| Comparative example 1 | 1' | 24 | 0.1 | 0.05 | 4.2 | — | 5.33 | 7.75 | 264.28 | 0.36 |
| Example 1 | 1 | 24 | 0.1 | 0.05 | 4.2 | 1.0 | 7.30 | 6.85 | 330.22 | 0.41 |
| Comparative example 2 | 1' | 24 | 0.1 | 0.05 | 3.2 | — | 4.61 | 8.55 | 182.38 | 0.32 |
| Example 2 | 1 | 24 | 0.1 | 0.05 | 3.2 | 1.0 | 6.91 | 7.15 | 237.94 | 0.38 |
| Example 3 | 1 | 24 | 0.1 | 0.05 | 3.2 | 1.5 | 7.50 | 6.75 | 242.63 | 0.41 |

Each of Comparative example 1 and Example 1 has a configuration in which 24 sensitive elements 31 with the width W1=0.1 mm and the length L1=4.2 mm are arranged with the gaps G1=0.05 mm. In addition, Example 1 includes the protrusion part 40 with the length L2=1.0 mm.

As shown in Table 1, in Example 1, the average magnetic field is large as compared to Comparative example 1. Further, the anisotropic magnetic field Hk is reduced, and the amount of change in the impedance ΔZmax and the sensitivity Smax are improved.

Comparative example 2 and Examples 2 and 3 are different from Comparative example 1 and Example 1 in that the length L1 of the sensitive element 31 is 3.2 mm. In addition, Example 2 includes the protrusion part 40 with the length L2=1.0 mm, and Example 3 includes the protrusion part 40 with the length L2=1.5 mm.

As shown in Table 1, in Examples 2 and 3, the average magnetic field is large as compared to Comparative example 1. Moreover, the anisotropic magnetic field Hk is reduced, and the amount of change in the impedance ΔZmax and the sensitivity Smax are improved. In Example 3 with the longer protrusion part 40, the average magnetic field is large as compared to Example 2. Moreover, the anisotropic magnetic field Hk is reduced, and the amount of change in the impedance ΔZmax and the sensitivity Smax are improved.

As described above, in the magnetic sensor 1 to which the exemplary embodiment of the present invention is applied (Examples 1 to 3), with the protrusion parts 40, the sensitivity is improved relative to the conventional magnetic sensor 1' (Comparative examples 1 and 2).

In addition, since improvement of the sensitivity was observed by elongating the length L2 of the protrusion part 40, in the magnetic sensor 1, the desired sensitivity can be obtained by adjusting the dimension of the protrusion part 40.

Second Exemplary Embodiment (Configuration of Magnetic Sensor 2 to which the Second Exemplary Embodiment is Applied)

Next, description will be given of a specific example of a magnetic sensor 2 to which the second exemplary embodiment is applied.

Figure 6A:
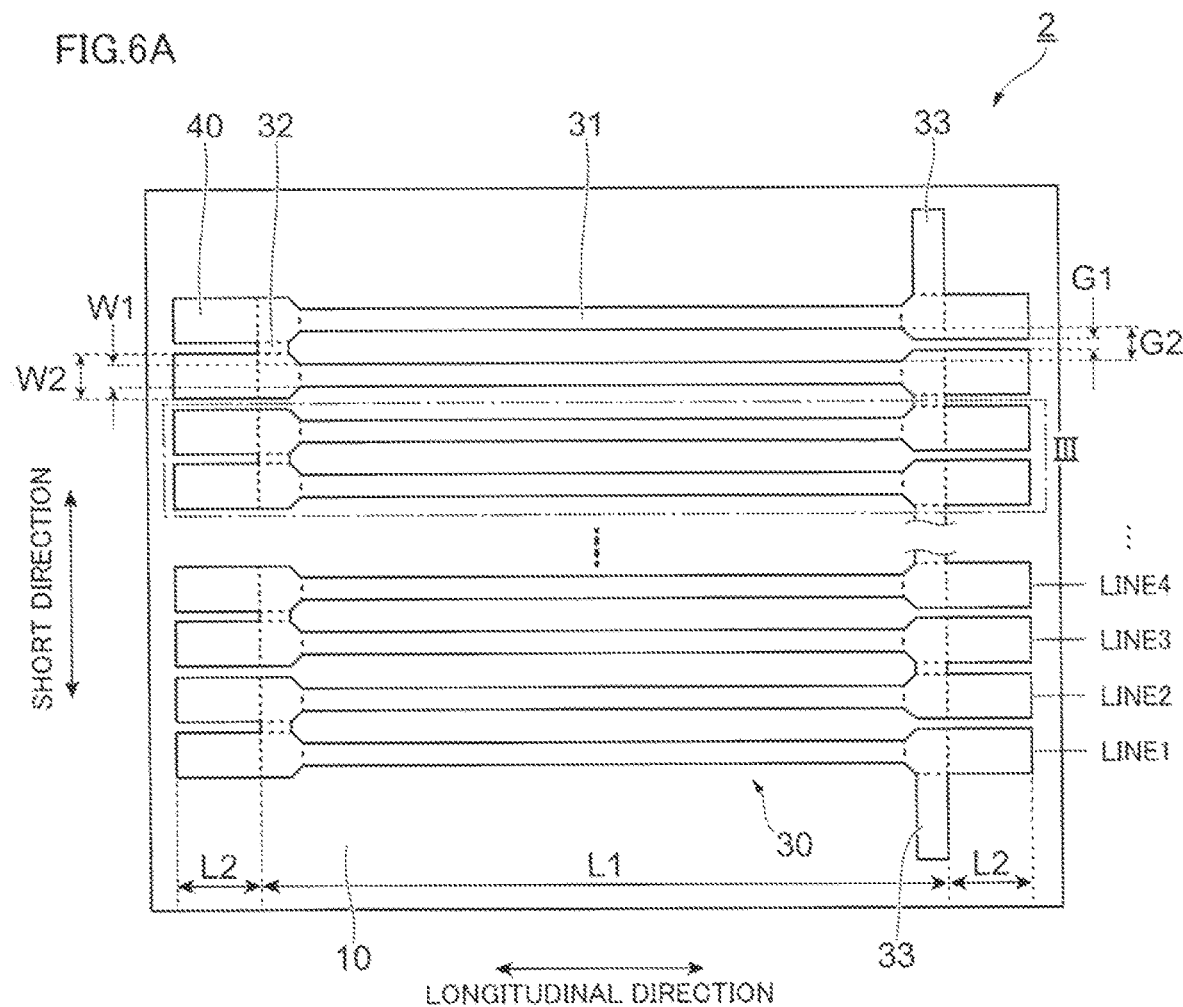
FIGS. 6A and 6B show diagrams illustrating a specific example of a magnetic sensor to which the second exemplary embodiment is applied.
Figure 6B:
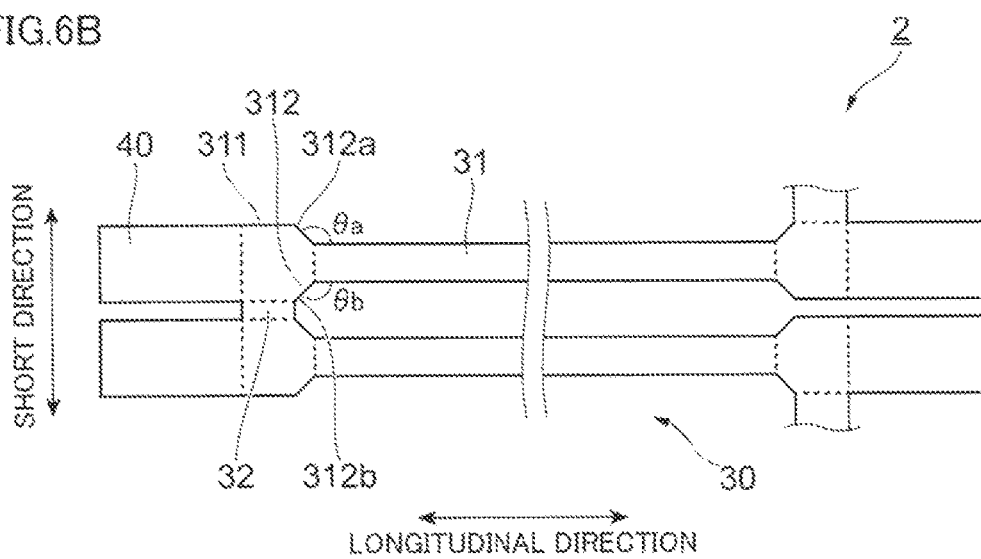

FIGS. 6A and 6B illustrate the second exemplary embodiment of the magnetic sensor, where FIG. 6A is a plan view of the magnetic sensor 2, and FIG. 6B is an enlarged view of the region III in FIG. 6A.

Note that, in the following description of the second exemplary embodiment, configurations similar to those of the first exemplary embodiment (FIGS. 1A and 1B) are assigned with same reference signs, and descriptions thereof will be omitted in some cases.

As shown in FIG. 6A, similar to the magnetic sensor 1, to which the first exemplary embodiment is applied, the magnetic sensor 2 includes: the non-magnetic substrate 10; the sensitive part 30 provided on the substrate 10 and including the soft magnetic material layer that senses the magnetic field; and the protrusion parts 40 including the soft magnetic material layer.

Note that the magnetic sensor 2 has a cross-sectional structure similar to that of the magnetic sensor 1 to which the first exemplary embodiment is applied (refer to FIG. 1B).

Similar to the magnetic sensor 1, the sensitive part 30 of the magnetic sensor 2 includes: plural sensitive elements 31; connection parts 32 windingly performing serial connection of the adjacent sensitive elements 31; and terminal parts 33 to which electric wires are connected to supply the electrical current.

As shown in FIG. 6B, the sensitive element 31 of the magnetic sensor 2 includes a wide part 311, which is wider in the short direction than the center portion, and a taper part 312 gradually narrowed from the wide part 311 toward the center portion, at each of both end portions in the longitudinal direction. The taper part 312 includes two sides 312a and 312b extending along the longitudinal direction, and the space between the two sides 312a and 312b is narrowed as approaching the center portion of the sensitive element 31.

Moreover, in the specific example of FIG. 6B, the inclined angles θa and θb, which are formed by the sides 312a and 312b, respectively, of the taper part 312 with the longitudinal direction, are 135 degrees. The inclined angles θa and θb may be set in the range of, for example, 110 degrees or more and 150 degrees or less, though the range varies depending on the width of the wide part 311, the width of the center portion of the sensitive element 31 in the short direction, and so on.

Here, as shown in FIG. 6A, plural sensitive elements 31 in the magnetic sensor 2 are each configured to have a size with the width W1 of the center portion, the width W2 of the wide part 311 at the end portion in the longitudinal direction, and the length L1 in the longitudinal direction. Note that the width W2 is larger than the width W1.

The plural sensitive elements 31 are arranged in the short direction with gaps, which are G1 for the portion of the sensitive element 31 having the width W2 (the portion of the wide part 311 at the end portion in the longitudinal direction), and G2 for the portion of the sensitive element 31 having the width W1 (the center portion in the longitudinal direction). Note that, similar to the magnetic sensor 1, the first, the second, the third, . . . , of the plural sensitive elements 31 arranged in the short direction counted from the bottom of the page are sometimes referred to as the line 1, the line 2, the line 3, . . . , respectively.

The connection part 32 is provided between end portions in the longitudinal direction of the sensitive elements 31 and windingly performs serial connection of the adjacent sensitive elements 31. Since the magnetic sensor 2 includes the wide part 311 at the end portion of the sensitive element 31, the adjacent sensitive elements 31 are connected at the portion of the wide part 311.

The protrusion part 40 is configured with a rectangular shape having a width equal to the width in the short direction of the wide part 311 of the sensitive element 31. Similar to the magnetic sensor 1, the protrusion part 40 protrudes in the longitudinal direction. Further, the protrusion part 40 has a rectangular shape with the width W2 in the short direction, which is equal to the width of the wide part 311, and the length L2 in the longitudinal direction. This makes it easier to induce the magnetic force lines from the outside to the sensitive element 31, as compared to the case in which the width of the protrusion part 40 is smaller than the width of the sensitive element 31. In addition, the magnetic force lines passed through the sensitive element 31 are induced to the protrusion parts 40 with ease.

(Action of Magnetic Sensor 2)

Subsequently, the action of the magnetic sensor 2, to which the second exemplary embodiment is applied, will be described, while being compared to a conventional magnetic sensor 2' that does not include the protrusion parts 40.

Figure 7:
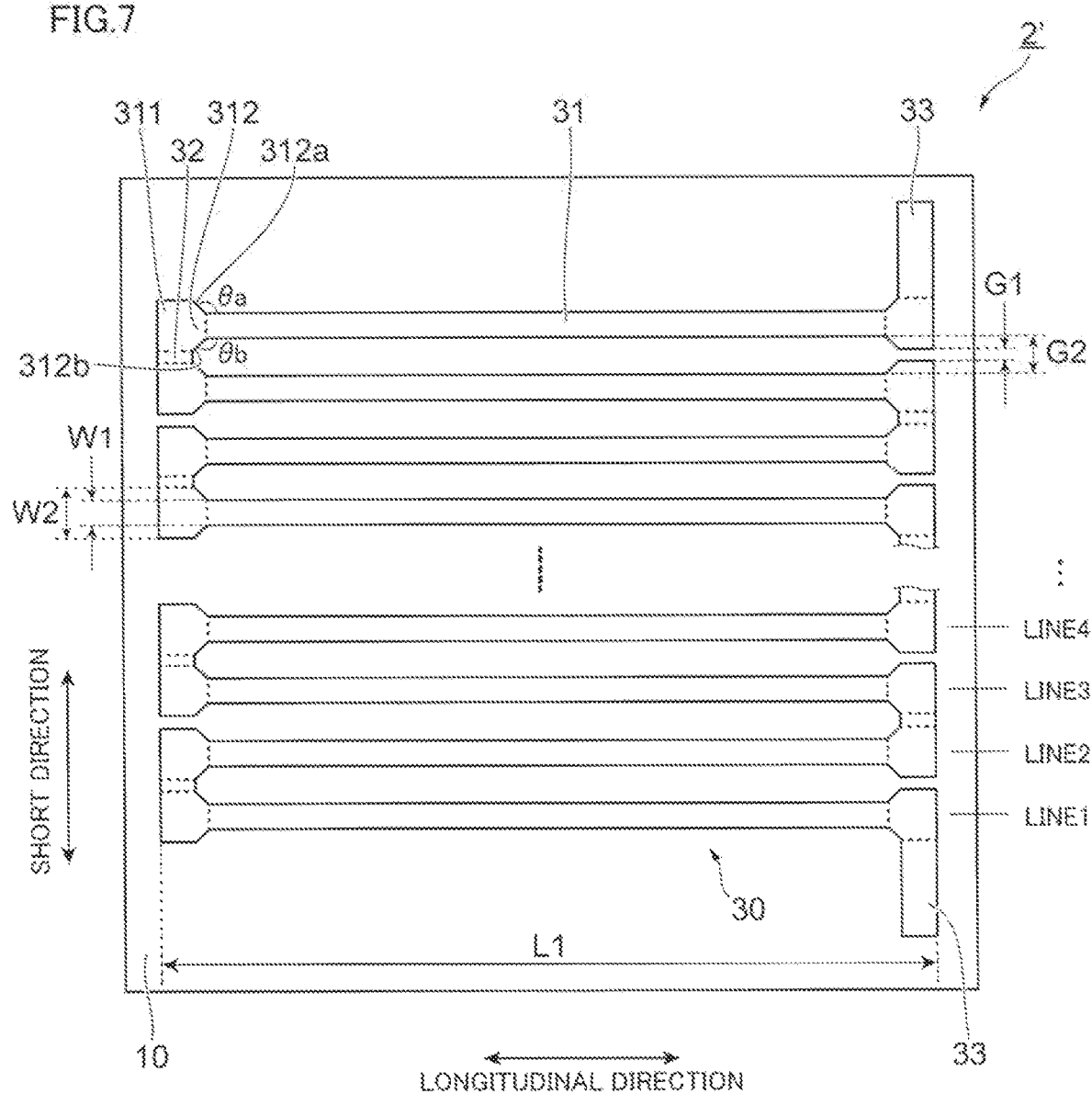
FIG. 7 shows a planar shape of a conventional magnetic sensor without including protrusion parts.

FIG. 7 shows a planar shape of the conventional magnetic sensor 2' without including the protrusion parts 40.

The conventional magnetic sensor 2' shown in FIG. 7 has the same configuration as the magnetic sensor 2 shown in FIG. 6A, except that the protrusion parts 40 are not included. For more details, the conventional magnetic sensor 2' is configured with the sensitive part 30 including the plural sensitive elements 31 provided with the wide parts 311 and the taper parts 312, the connection parts 32, and the terminal parts 33, and the non-magnetic substrate 10.

Figure 8A:
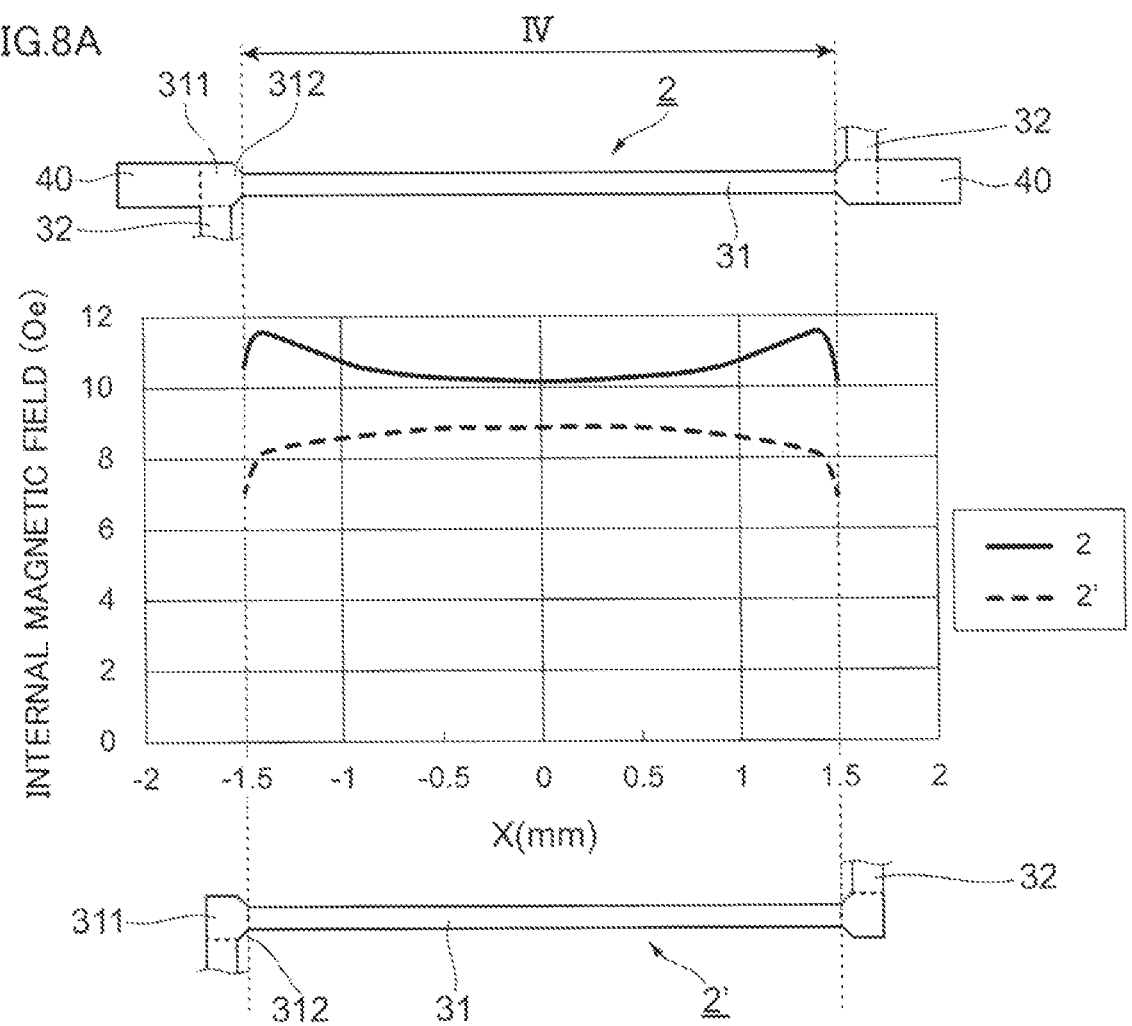
FIGS. 8A and 8B show simulation results of the magnitude of the internal magnetic field in the sensitive part when the external magnetic field of a predetermined magnitude is applied to the magnetic sensor.
Figure 8B:
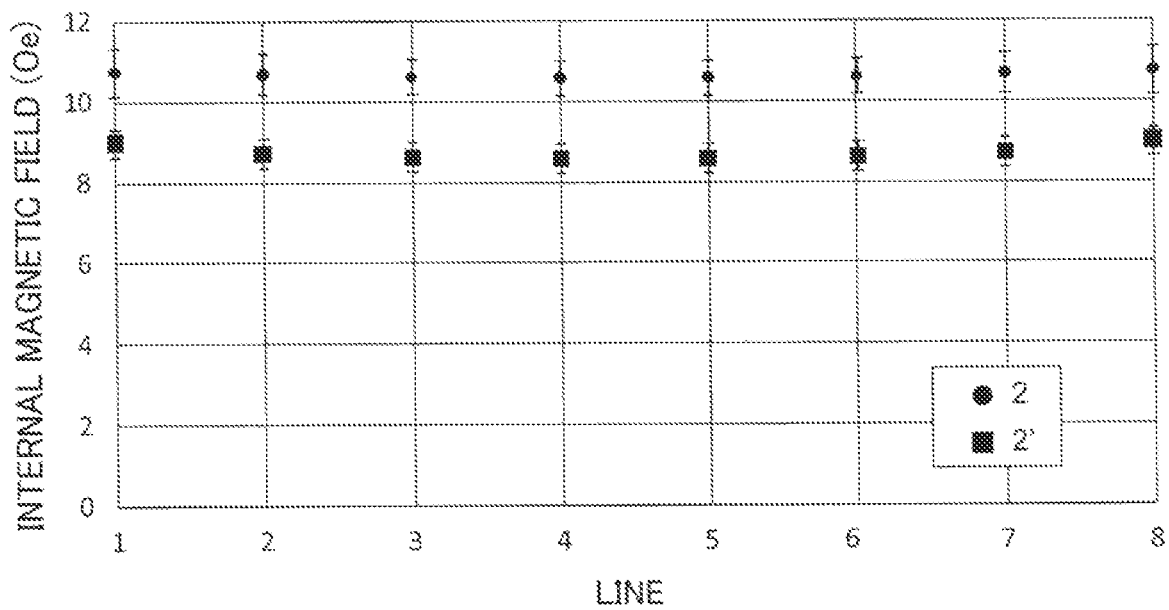

FIGS. 8A and 8B show simulation results of the magnitude of the internal magnetic field in the sensitive part 30 when the external magnetic field of a predetermined magnitude is applied to the magnetic sensors 2 and 2'. FIG. 8A shows the magnitude of the internal magnetic field in the sensitive part 30 as the distribution along the longitudinal direction, and FIG. 8B shows the internal magnetic field in each line of the magnetic sensors 2 and 2'. Note that FIG. 8A shows the shape of the sensitive element 31, the connection parts 32, and the protrusion parts 40 of the magnetic sensors 2 and 2', as well as the magnitude of the magnetic field applied to the sensitive part 30.

Note that, in this simulation, the external magnetic field applied to the magnetic sensors 2 and 2' is assumed to be 10 Oe. It is also assumed that the number of sensitive elements 31 in the magnetic sensors 2 and 2' is 8 (the line 1 to the line 8), the width W1, the width W2, and the length L1 of the sensitive element 31 are 0.08 mm, 0.38 mm, and 3.9 mm, respectively, the gaps G1 and G2 between the adjacent sensitive elements 31 are 0.12 mm and 0.42 mm, respectively, the inclined angle θa=the inclined angle θb=135 degrees, and further, the length L2 of the protrusion part 40 of the magnetic sensor 2 is 1.0 mm.

As shown in FIG. 8A, in the magnetic sensor 2 with the protrusion parts 40, the magnitude of the internal magnetic field is increased as compared to the conventional magnetic sensor 2' without the protrusion parts 40. In addition, reduction in the magnetic field at the end portions in the longitudinal direction is suppressed.

Next, FIG. 8B shows the magnitude of the internal magnetic field in each of the lines 1 to 8 of the sensitive elements 31 included in the magnetic sensors 2 and 2'. The horizontal axis indicates the number N of the corresponding line, and the vertical axis indicates the average value (Oe) of the magnitude of the internal magnetic field in the line N. Note that the error bar shows the distribution of the magnitude of the internal magnetic field in the line N.

As shown in FIG. 8B, in the magnetic sensor 2, the magnitude of the internal magnetic field is increased in all lines (the lines 1 to 8) of the sensitive elements 31, as compared to the conventional magnetic sensor 2'.

In the magnetic sensor 2 to which the second exemplary embodiment is applied, the protrusion parts 40 with the width same as the width in the short direction of the wide part 311 of the sensitive element 31 are provided, and thereby the magnetic force lines from a wide range in the outside are induced to the sensitive element 31. In addition, the magnetic force lines passed through the sensitive element 31 are induced to directly pass through the protrusion parts 40.

As a result, in the magnetic sensor 2, the magnetic field is concentrated on the sensitive element 31 and the magnetic flux density is increased, as compared to the conventional magnetic sensor 2'. In addition, reduction in the magnetic flux density at the end portions of the sensitive element 31 is suppressed. Then, as compared to the conventional magnetic sensor 2', the magnetic field related to the sensitive element 31 is increased.

Further, with reference to FIGS. 4A, 4B, 8A, and 8B, in the magnetic sensor 2, the magnitude of the internal magnetic field in the sensitive element 31 is increased as compared to the conventional magnetic sensor 1.

The magnetic sensor 2 has the wide parts 311 and the taper parts 312 at the end portions of the sensitive element 31; therefore, the effect of inducing the magnetic force lines described above becomes larger than that of the magnetic sensor 1, in which the sensitive element 31 has a rectangular shape. As a result, as compared to the magnetic sensor 1, the magnetic field related to the sensitive element 31 is increased in the magnetic sensor 2.

Table 2 shows values of the average magnetic field, the anisotropic magnetic field Hk, the amount of change in the impedance ΔZmax, and the sensitivity Smax for the magnetic sensor 2 to which the exemplary embodiments of the present invention are applied and the conventional magnetic sensor 2'.

The shape in Table 2 indicates which configuration of the magnetic sensors 2 or 2', as described in FIGS. 6A, 6B and 7, each of the examples and comparative examples corresponds to. The shape 2 corresponds to the magnetic sensor 2 shown in FIG. 6A, to which the second exemplary embodiment is applied, and the shape 2' corresponds to the conventional magnetic sensor 2' shown in FIG. 7.

Similar to Examples 1 to 3 and Comparative examples 1 and 2 described in Table 1, Example 4 and Comparative example 3 described in Table 2 are magnetic sensors including: the substrate 10 configured with a glass substrate; the soft magnetic material layers 101a to 101d each configured with a $Co_{80}Nb_{17}Zr_3$ layer with a thickness of 500 nm; the magnetic domain suppression layers 102a and 102b each configured with a CrTi layer with a thickness of 25 nm; and the conductor layer 103 configured with an Ag layer with a thickness of 400 nm.

The values of the average magnetic field, the anisotropic magnetic field Hk, the amount of change in the impedance ΔZmax and the sensitivity Smax in Table 2 were obtained in the same manner as the values described in Table 1.

TABLE 2

| | Shape | The number of sensitive elements | W1 (mm) | W2 (mm) | G1 (mm) | G2 (mm) | L1 (mm) | L2 (mm) | Average magnetic field (Oe) | Hk (Oe) | ΔZmax (Ω) | Smax (1/Oe) |
|---|---|---|---|---|---|---|---|---|---|---|---|---|
| Comparative example 3 | 2' | 8 | 0.08 | 0.38 | 0.12 | 0.42 | 3.9 | — | 8.76 | 5.75 | 77.26 | 0.41 |
| Example 4 | 2 | 8 | 0.08 | 0.38 | 0.12 | 0.42 | 3.9 | 1.0 | 10.68 | 5.40 | 75.20 | 0.47 |

Each of Comparative example 3 and Example 4 has a configuration in which 8 sensitive elements 31 with the widths W1=0.08 mm, W2=0.38 mm, the length L1=3.9 mm, and the inclined angle of the taper part 312 θa=the inclined angle of the taper part 312 θb=135 degrees are arranged with the gaps G1=0.12 mm, and G2=0.42 mm. In addition, only Example 4 includes the protrusion part 40 with the length L2=1.0 mm.

As shown in Table 2, in Example 4, the average magnetic field is large as compared to Comparative example 3. Moreover, the anisotropic magnetic field Hk is reduced, and the sensitivity Smax is improved.

Further, in Example 4 provided with the sensitive elements 31 including the wide parts 311 and the taper parts 312, the average magnetic field is large as compared to Examples 1 to 3 (refer to Table 1) including the rectangular-shaped sensitive elements 31. Moreover, the anisotropic magnetic field Hk is reduced, and the sensitivity Smax is improved.

As described above, in the magnetic sensor 2 to which the exemplary embodiment of the present invention is applied (Example 4), with the protrusion parts 40, the sensitivity is improved relative to the conventional magnetic sensor 2' (Comparative example 3).

In addition, the magnetic sensor 2 provided with the sensitive elements 31 including the wide parts 311 and the taper parts 312 (Example 4), the sensitivity is improved as compared to magnetic sensor 1 (Examples 1 to 3) including the rectangular-shaped sensitive elements 31. As described above, since improvement of the sensitivity was observed by adding the wide parts 311 and the taper parts 312, the desired sensitivity can be obtained by adjusting the shape of the sensitive element 31.

So far, the exemplary embodiments have been described; however, various modifications may be available without deviating from the gist of the present invention.

Figure 9:
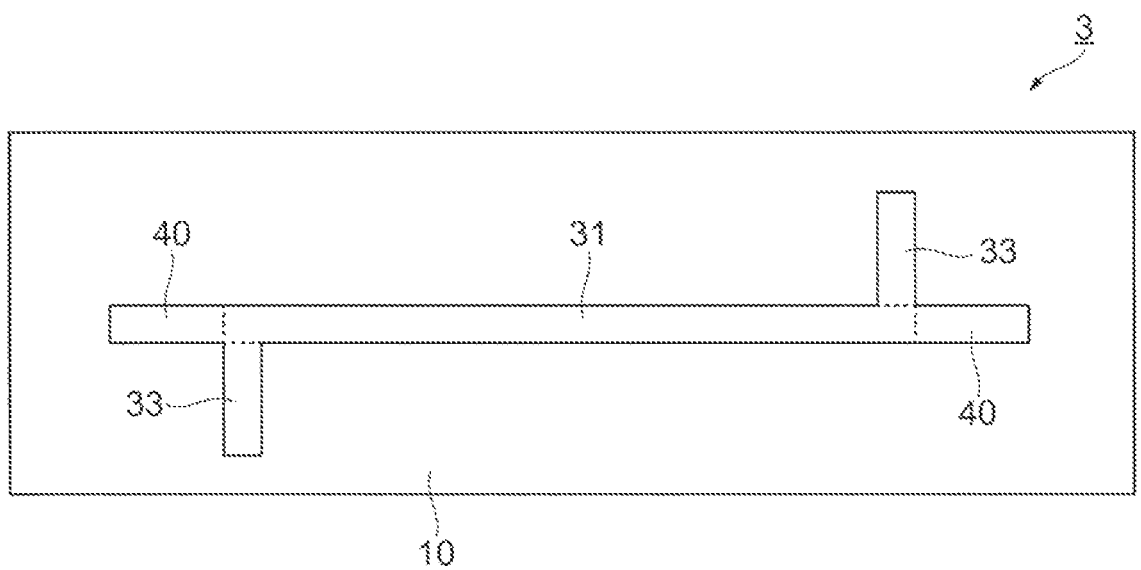
FIG. 9 shows a specific example of a magnetic sensor provided with one sensitive element.

For example, in the first and second exemplary embodiments, the magnetic sensors 1 and 2 including the plural sensitive elements 31 were described; however, as shown in FIG. 9, in a magnetic sensor 3 including one sensitive element 31, the sensitivity can be improved by including the protrusion parts 40, as compared to the case where the protrusion parts 40 are not included.

In addition, for example, the width of the connection parts 32 may be adjusted in the magnetic sensors 1, 2, and 3.

Here, FIGS. 10A to 10E illustrate modified examples adjusting the width of the connection parts 32 as against Example 1 in Table 1. FIG. 10A shows the planar shape of Example 1, and FIGS. 10B to 10E show the planar shapes of Modified examples 1 to 4. Note that, in FIGS. 10A to 10E, some of the parts of the structure of the magnetic sensor, such as the substrate 10, are omitted.

FIGS. 10B and 10C show Modified example 1 in which the width of the connection part 32 in the longitudinal direction is made wider as against Example 1 and Modified example 2 in which the width is further made wider, respectively.

Here, as the width of the connection part 32 in the longitudinal direction is wider, the length L1 of the sensitive element 31 is increased. In Modified examples 1 and 2, the length L2 of the protrusion part 40 is reduced by the increase in the length L1 so that Example 1 and Modified examples 1 and 2 are configured to have the equal sum of the lengths L1+L2. Note that, as illustrated, among the plural sensitive elements 31 in Modified examples 1 and 2, the sensitive element 31' arranged at the end in the short direction is not connected to the connection part 32 at one end in the longitudinal direction (right side in the figure). Therefore, the length L2' of the protrusion part 40' protruding from one end of the sensitive element 31' is equal to the length L2 in Example 1.

In addition, as a result of configuring Modified example 3 shown in FIG. 10D so that the sum of the lengths L1+L2 is equal to that of Example 1 and the width of the connection part 32 is further increased, Modified example 3 does not include the protrusion parts 40 that protrude from the end portions of the sensitive element 31 (L2=0). However, in the sensitive element 31' arranged at the end in the short direction, the protrusion part 40' with the length L2', which is equal to the length L2 of the protrusion part 40 in Example 1, protrudes from one end in the longitudinal direction (from the right side in the figure).

In the magnetic sensor including the plural sensitive elements as described above, at least one sensitive element may include the protrusion part protruding from the end portion in the longitudinal direction.

Further, in Modified example 4 shown in FIG. 10E, only the shape of the end portion of the sensitive element 31' in the longitudinal direction and the shape of the protrusion part 40 are different from those in Modified example 3. For more details, the sensitive element 31' includes a trapezoidal-shaped vane part 41a that extends in the short direction on the side (on the left side in the figure) different from the end portion where the protrusion part 40' protrudes, of the end portions in the longitudinal direction. In addition, the protrusion part 40' of the sensitive element 31' includes a substantially trapezoidal-shaped vane part 41b extending in the short direction.

In this manner, in addition to increasing the width of the connection part 32, the sensitive element 31 (31') and the protrusion part 40 (40') may be changed into the shape that is different from the rectangular shape.

In the above-described Modified examples 1 to 4, the effects substantially the same as those in Example 1 can be obtained. For more details, Modified examples 1 to 4 function as the magnetic sensors with average magnetic field and values of Hk, ΔZmax, and Smax, which are substantially equivalent to that of Example 1.

Moreover, in the magnetic sensors 1, 2, and 3, specific examples of the protrusion part 40 that protrudes in the longitudinal direction (in the direction parallel to the longitudinal direction) from the end portion of the sensitive element 31 in the longitudinal direction were shown; however, the protrusion part 40 may protrude in a direction different from the longitudinal direction (in a direction intersecting the longitudinal direction). In other words, the protrusion part 40 may be arranged to be inclined to the longitudinal direction.

Further, in the magnetic sensors 1, 2, and 3, specific examples of the sensitive element 31 having the protrusion parts 40 with the same length and the same shape at both ends in the longitudinal direction thereof were described; however, the length and the shape of the protrusion parts 40 at both ends may be different. In addition, like the protrusion part 40' in the above-described Modified examples 3 and 4, the protrusion part may be provided only at any one end in the longitudinal direction.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor comprising:
   a non-magnetic substrate;
   a sensitive element provided on the substrate, including a soft magnetic material, having a longitudinal direction and a short direction, provided with uniaxial magnetic anisotropy in a direction intersecting the longitudinal direction, and sensing a magnetic field by a magnetic impedance effect; and
   a protrusion part including a soft magnetic material and protruding from an end portion in the longitudinal direction of the sensitive element, wherein
   the sensitive element and the protrusion part are in contact.

2. The magnetic sensor according to claim 1, wherein the protrusion part protrudes in the longitudinal direction.

3. The magnetic sensor according to claim 1, wherein the sensitive element has a wide shape at the end portion in the longitudinal direction, the wide shape having a width in the short direction that is wider than a width in the short direction at a center portion in the longitudinal direction.

4. The magnetic sensor according to claim 2, wherein the sensitive element includes a wide shape at the end portion in the longitudinal direction, the wide shape having a width in the short direction that is wider than a width in the short direction at a center portion in the longitudinal direction.

5. The magnetic sensor according to claim 3, wherein the sensitive element has a taper shape that is narrowed from the wide shape toward the center portion.

6. The magnetic sensor according to claim 4, wherein the sensitive element has a taper shape that is narrowed from the wide shape toward the center portion.

7. The magnetic sensor according to claim 1, wherein the protrusion part has a width equal to a maximum width in the short direction of the sensitive element.

8. The magnetic sensor according to claim 2, wherein the protrusion part has a width equal to a maximum width in the short direction of the sensitive element.

9. The magnetic sensor according to claim 3, wherein the protrusion part has a width equal to a maximum width in the short direction of the sensitive element.

10. The magnetic sensor according to claim 4, wherein the protrusion part has a width equal to a maximum width in the short direction of the sensitive element.

11. The magnetic sensor according to claim 5, wherein the protrusion part has a width equal to a maximum width in the short direction of the sensitive element.

12. The magnetic sensor according to claim 6, wherein the protrusion part has a width equal to a maximum width in the short direction of the sensitive element.

13. A magnetic sensor comprising:
    a non-magnetic substrate;
    a plurality of sensitive elements arranged in a short direction with gaps, each of the sensitive elements being provided on the substrate, including a soft magnetic material, having a longitudinal direction and the short direction, being provided with uniaxial magnetic anisotropy in a direction intersecting the longitudinal direction, and sensing a magnetic field by a magnetic impedance effect;
    a connection part connecting end portions in the longitudinal direction of the sensitive elements that are adjacent in the short direction; and
    a protrusion part included in at least one of the sensitive elements, the protrusion part including a soft magnetic material and protruding from an end portion in the longitudinal direction of the sensitive element, wherein
    the protrusion part is in contact with at least one sensitive element of the plurality of sensitive elements.

14. The magnetic sensor according to claim 13, wherein the connection part includes a plurality of connection parts, and
    the plural sensitive elements are windingly connected in series by the plural connection parts.

* * * * *